United States Patent
Liang

(10) Patent No.: US 12,117,738 B2
(45) Date of Patent: Oct. 15, 2024

(54) RETICLE DETECTION APPARATUS, RETICLE DETECTION METHOD, EXPOSURE MACHINE AND PHOTOLITHOGRAPHY DEVICE

(71) Applicant: CHANGXIN MEMORY TECHNOLOGIES, INC., Hefei (CN)

(72) Inventor: Xueyu Liang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 538 days.

(21) Appl. No.: 17/593,205

(22) PCT Filed: Apr. 30, 2021

(86) PCT No.: PCT/CN2021/091636
§ 371 (c)(1),
(2) Date: Sep. 10, 2021

(87) PCT Pub. No.: WO2021/227903
PCT Pub. Date: Nov. 18, 2021

(65) Prior Publication Data
US 2022/0308461 A1  Sep. 29, 2022

(30) Foreign Application Priority Data
May 15, 2020 (CN) .......................... 202010412428.2

(51) Int. Cl.
*G03F 7/00* (2006.01)
(52) U.S. Cl.
CPC ...... *G03F 7/70741* (2013.01); *G03F 7/70716* (2013.01); *G03F 7/7085* (2013.01); *G03F 7/70866* (2013.01)

(58) Field of Classification Search
CPC ............ G03F 7/70741; G03F 7/70716; G03F 7/7085; G03F 7/70866; G03F 7/20;
(Continued)

(56) References Cited

U.S. PATENT DOCUMENTS 6,477,898 B1 * 11/2002 Han ..................... G01N 29/348
73/659
2004/0174509 A1 * 9/2004 Jansen ................ G03F 7/70983
355/53
(Continued)

FOREIGN PATENT DOCUMENTS

CN   203643743 U   6/2014
CN   107422615 A * 12/2017 ......... G03F 7/70733
(Continued)

OTHER PUBLICATIONS

English translation of CN110941145 (Year: 2020).*
(Continued)

*Primary Examiner* — Christina A Riddle
(74) *Attorney, Agent, or Firm* — Syncoda LLC; Feng Ma

(57) ABSTRACT

A reticle detection apparatus includes a processing unit, an optical detection unit, and an auxiliary detection unit; the optical detection unit is configured to determine whether there is a reticle according to the intensity of the received light; the processing unit is configured to start the auxiliary detection unit when the optical detection unit does not detect the reticle; the auxiliary detection unit is configured to detect whether there is a reticle based on the piezoelectric effect or the acoustoelectric effect; wherein, after the auxiliary detection unit is started, the processing unit is configured to serve the detection result of the auxiliary detection unit as a basis for determining whether there is a reticle.

20 Claims, 10 Drawing Sheets

(58) Field of Classification Search
CPC .... G03F 7/70733; G03F 7/70783; G03F 7/70;
G03F 7/70691; G03F 7/707; G03F
7/70725; G03F 7/70758; G03F 7/708;
G03F 7/70825; G03F 7/70833; G03F
7/70858; G03F 7/70975; G03F 7/70983;
G03F 7/70991; G03F 1/66; G03F 1/22;
G03F 1/68; G03F 1/82; G03F 1/84
USPC .............................. 355/18, 30, 52–55, 67–77
See application file for complete search history.

(56) References Cited

U.S. PATENT DOCUMENTS

| | | | |
|---|---|---|---|
| 2006/0114432 A1* | 6/2006 | Kuo | G03F 7/7085 355/75 |
| 2006/0170902 A1 | 8/2006 | Won et al. | |
| 2007/0099099 A1* | 5/2007 | Onvlee | G03F 7/70516 430/30 |
| 2013/0043776 A1 | 2/2013 | Wu | |
| 2017/0122913 A1* | 5/2017 | Riviere | G03F 1/62 |
| 2020/0075373 A1* | 3/2020 | Lee | H01L 21/67775 |

FOREIGN PATENT DOCUMENTS

| | | | | | |
|---|---|---|---|---|---|
| CN | 208383095 U | * | 1/2019 | | |
| CN | 108374626 B | | 8/2019 | | |
| CN | 110941145 A | | 3/2020 | | |
| CN | 110941145 B | * | 7/2021 | ......... | G03F 7/70741 |
| GB | 2292636 B | | 12/1998 | | |
| JP | 2001244313 A | * | 9/2001 | ......... | G03F 7/70741 |
| KR | 20040082685 A | | 9/2004 | | |
| WO | 2004006011 A2 | | 1/2004 | | |

OTHER PUBLICATIONS

English translation of CN107422615. (Year: 2017).*
English translation of CN208383095 (Year: 2019).*
English translation of JP2001-244313 (Year: 2001).*
China first office action in Application No. 202010412428.2, mailed on Mar. 16, 2022.

* cited by examiner

RETICLE DETECTION APPARATUS, RETICLE DETECTION METHOD, EXPOSURE MACHINE AND PHOTOLITHOGRAPHY DEVICE

CROSS-REFERENCE TO RELATED APPLICATIONS

This application is a national stage of International Application No. PCT/CN2021/091636 filed on Apr. 30, 2021, which claims priority to Chinese Patent Application No. 202010412428.2 filed on May 15, 2020. The disclosures of these applications are hereby incorporated by reference in their entirety.

TECHNICAL FIELD

The present application relates to the technical field of semiconductor photolithography, and in particular to a reticle detection apparatus, a reticle detection method, an exposure machine, and a photolithography device.

BACKGROUND

Photolithography, as a main process in the production of integrated circuits, is a pattern transfer technique in which the pattern on the mask is transferred to the substrate coated with photoresist and a specific part of the film on the surface of the substrate is removed by a series of processes. The general photolithography process has steps of substrate surface cleaning, drying, primer coating, spin coating of photoresist, soft baking, alignment, exposure, post-baking, developing, hard baking, etching, and detection; wherein the exposure process requires a reticle.

Generally, a reticle may have defects due to factors such as environment, storage method, exposure wavelength, or exposure energy during daily use. In order to avoid product yield loss and delay in production cycle due to the reticle defects, the reticle needs to be detected by an IRIS (Intelligent Reticle Inspection Station) for particles. At present, when the exposure machine is performing detection, the optical sensor in the IRIS first determines that the reticle has been placed on the bearing surface before subsequent detection. With the development of technology, due to the continuous iterative update of products, the reticle used is also changing. When a conventional optical sensor is used to detect a reticle with high transparency, the light reflected by the reticle is less received by the optical sensor. As a result, the optical sensor fails to detect the reticle. This may be considered as "reticle lost", resulting in machine downtime.

SUMMARY

In view of this, embodiments of the present application provide a reticle detection apparatus, a reticle detection method, an exposure machine, and a photolithography device to improve the detection accuracy of the reticle and help to avoid machine downtime.

In a first aspect, an embodiment of the present application provides a reticle detection apparatus, comprising: a processing unit, an optical detection unit, and an auxiliary detection unit;

the optical detection unit is configured to determine whether there is a reticle according to the intensity of the received light;

the processing unit is configured to start the auxiliary detection unit when the optical detection unit does not detect the reticle;

the auxiliary detection unit is configured to detect whether there is a reticle based on the piezoelectric effect or the acoustoelectric effect;

wherein, after the auxiliary detection unit is started, the processing unit is configured to serve the detection result of the auxiliary detection unit as a basis for determining whether there is a reticle.

In a second aspect, an embodiment of the present application further provides a reticle detection method, executed by any of the reticle detection apparatuses provided in the first aspect, and the reticle detection method comprises:

determining, by the optical detection unit, whether there is a reticle according to the intensity of the received light;

starting, by the processing unit, the auxiliary detection unit when the optical detection unit does not detect the reticle;

detecting, by the auxiliary detection unit, whether there is a reticle based on the piezoelectric effect or the acoustoelectric effect;

wherein, after the auxiliary detection unit is started, the processing unit serves the detection result of the auxiliary detection unit as a basis for determining whether there is a reticle.

In a third aspect, an embodiment of the present application further provides an exposure machine, comprising any of the reticle detection apparatuses provided in the first aspect.

In a fourth aspect, an embodiment of the present application further provides a photolithography device, comprising any of the exposure machines provided in the second aspect.

In the reticle detection apparatus, reticle detection method, exposure machine, and photolithography device according to the embodiments of the present application, by providing an auxiliary detection unit that is started when the optical detection unit does not detect the reticle and detects whether there is a reticle based on the piezoelectric effect or the acoustoelectric effect, when there is a reticle, the reticle can be detected regardless of the transparency of the reticle. Thus, the processing unit can start the auxiliary detection unit when the optical detection unit does not detect the reticle to realize auxiliary detection of the reticle. It is beneficial to improve the detection accuracy of the reticle and thus helps to avoid machine downtime.

BRIEF DESCRIPTION OF THE DRAWINGS

In order to more clearly describe the technical solutions of the exemplary embodiments of the present application, the drawings to be used in the description of the embodiments will be briefly introduced below. Obviously, the drawings introduced here are just drawings of some of the embodiments of the present application to be described below, not all of the drawings. For a person of ordinary skill in the art, other drawings may be obtained according to these drawings without paying any creative effort.

DETAILED DESCRIPTION

In order to make the purposes, technical solutions, and advantages of the present application clearer, the technical solutions of the present application will be fully described below through specific implementations with reference to the drawings in the embodiments of the present application. Apparently, the described embodiments are some of the embodiments of the present application, not all of the embodiments. Based on the embodiments of the present application, all other embodiments obtained by a person of ordinary skill in the art without paying any creative effort shall fall into the protection scope of the present application.

The improvements of the reticle detection apparatus, reticle detection method, exposure machine, and photolithography device according to the embodiments of the present application at least comprise: by providing an auxiliary detection unit that is started when the optical detection unit does not detect the reticle and detects whether there is a reticle based on the piezoelectric effect or the acoustoelectric effect (the detection principle is not related to light), a reticle can be effectively detected regardless of the transparency of the reticle. Thus, the processing unit can start the auxiliary detection unit when the optical detection unit does not detect the reticle to realize auxiliary detection of the reticle. It is beneficial to improve the detection accuracy of the reticle and thus helps to avoid machine downtime.

The reticle detection apparatus, reticle detection method, exposure machine, and photolithography device according to the embodiments of the present application will be exemplarily described below with reference to FIG. 1 to FIG. 17.

Figure 1:
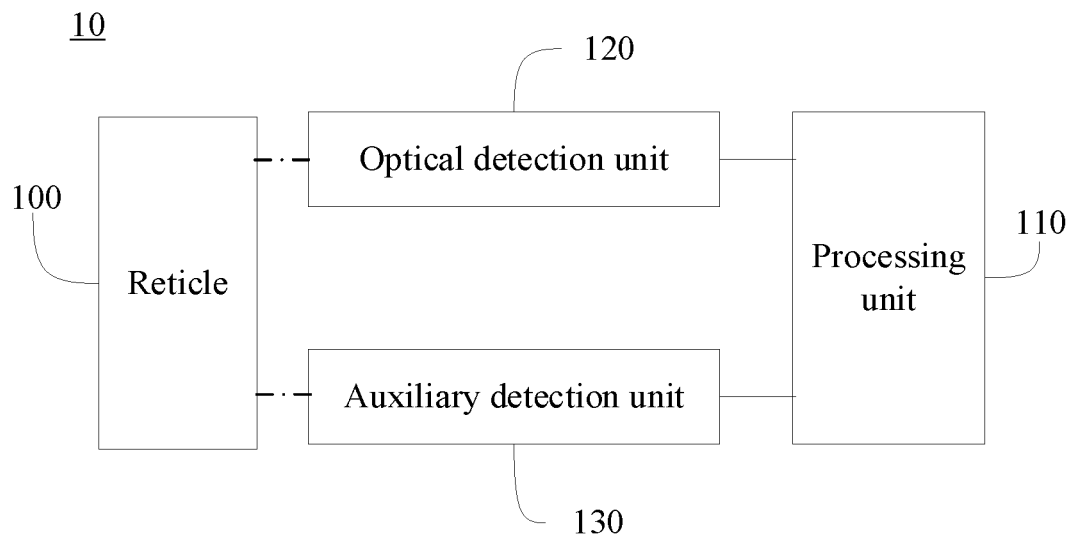
FIG. 1 is a schematic structure diagram of a reticle detection apparatus according to an embodiment of the present application.

Exemplarily, FIG. 1 shows a structural block diagram of the reticle detection apparatus 10. Referring to FIG. 1, the reticle detection apparatus 10 comprises: a processing unit 110, an optical detection unit 120, and an auxiliary detection unit 130; the optical detection unit 120 is configured to determine whether there is a reticle 100 according to the intensity of the received light that is reflected from the reticle 100 side; the processing unit 110 is configured to start the auxiliary detection unit 130 when the optical detection unit 120 does not detect the reticle 100; the auxiliary detection unit 130 is configured to detect whether there is a reticle 100 based on the piezoelectric effect or the acoustoelectric effect; wherein, after the auxiliary detection unit 130 is started, the processing unit 110 is configured to serve the detection result of the auxiliary detection unit 130 as a basis for determining whether there is a reticle 100.

Exemplarily, the optical detection unit 120 may be a reflective optical detection unit or an optical detection unit in another form, which is not limited in the embodiment of the present application.

The detection principle of the auxiliary detection unit 130 has nothing to do with the light intensity. As long as the reticle 100 is successfully loaded in the reticle detection apparatus 10, the reticle 100 may be detected by the auxiliary detection unit 130. Therefore, when the optical detection unit 120 fails to detect the high-transparency reticle 100, the processing unit 110 can start the auxiliary detection unit 130 to perform auxiliary detection, and the detection result of the auxiliary detection unit 130 shall prevail. That is, after the auxiliary detection unit 130 is started when the optical detection unit 120 fails to detect the reticle, if the auxiliary detection unit 130 detects the reticle 100, it is determined that the reticle 100 has been loaded normally; and if the auxiliary detection unit 130 does not detect the reticle 100, it is determined the reticle 100 is lost, and the processing unit 110 prompts the staff to perform follow-up processing according to the "reticle lost" information.

In the reticle detection apparatus 10 according to the embodiments of the present application, when the optical detection unit 120 fails to detect the reticle, the auxiliary detection unit 130 may be used to detect the reticle, so that the detection accuracy of the reticle 100 may be improved and it helps to avoid machine downtime.

In other embodiments, the reticle detection apparatus may further comprise other structural components known to those skilled in the art, such as a focus mover and a gripper, to detect the reticle after ensuring that the reticle has been loaded normally and then display the detection result.

Hereinafter, the working principle and adjustment method of the optical detection unit 120 and the reticle detection apparatus 10 based thereon will be exemplarily described.

Figure 2:
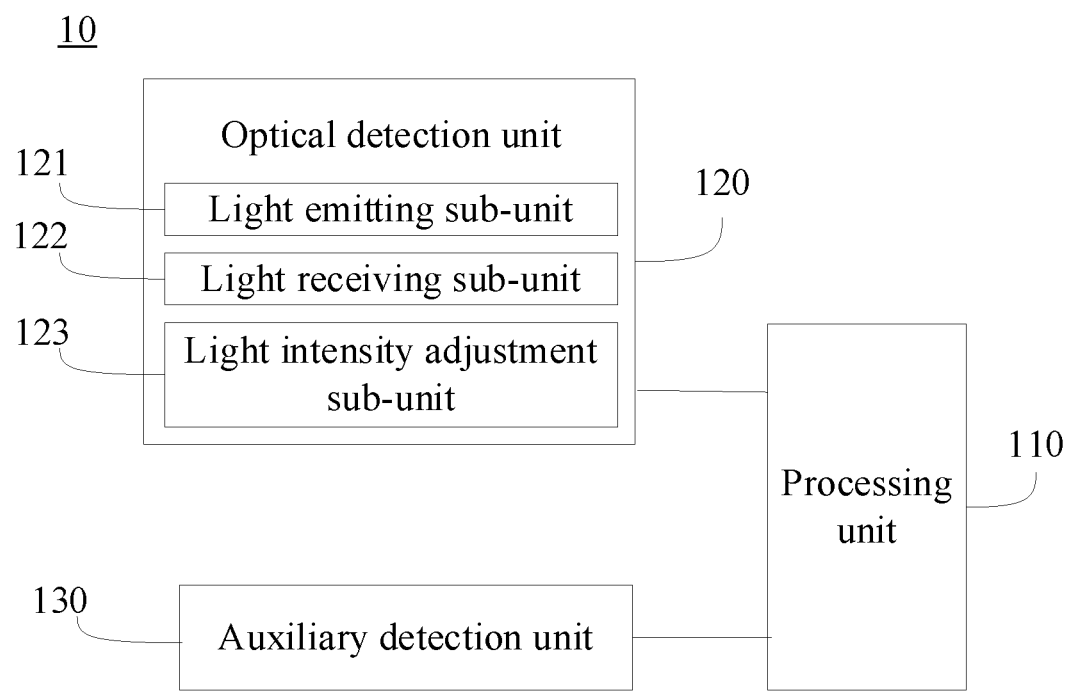
FIG. 2 is a physical view of another reticle detection apparatus according to an embodiment of the present application.
Figure 3:
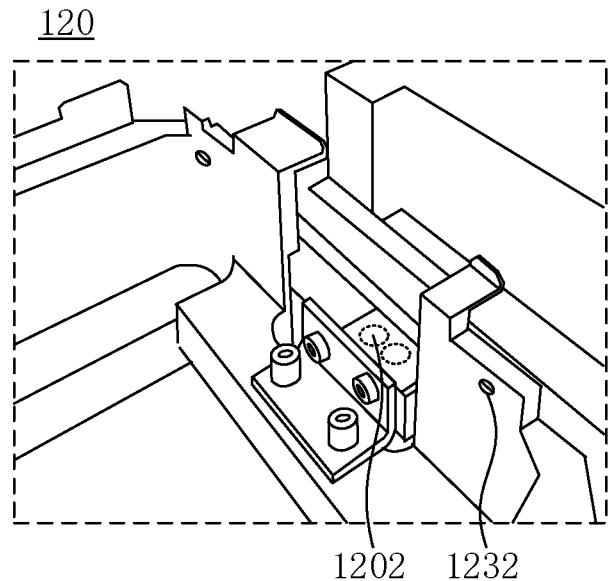
FIG. 3 is a stereoscopic structure diagram related to optical detection according to an embodiment of the present application.

In an embodiment, referring to FIGS. 2 and 3, the optical detection unit 120 may comprise a light emitting sub-unit 121, a light receiving sub-unit 122, and a light intensity adjustment sub-unit 123; the light emitting sub-unit 121 is configured to emit light irradiated to the reticle 100 side; the light receiving sub-unit 122 is configured to receive light reflected from the reticle 100 side; and the light intensity adjustment sub-unit 123 is configured to adjust the outgoing light intensity of the outgoing light emitted by the light emitting sub-unit 121, so that the intensity of the reflected light received by the light receiving sub-unit 122 is greater than a preset light intensity threshold when the auxiliary detection unit 130 detects the reticle 100, thereby which realizes the optical detection unit 120 detects the reticle 100.

Figure 4:
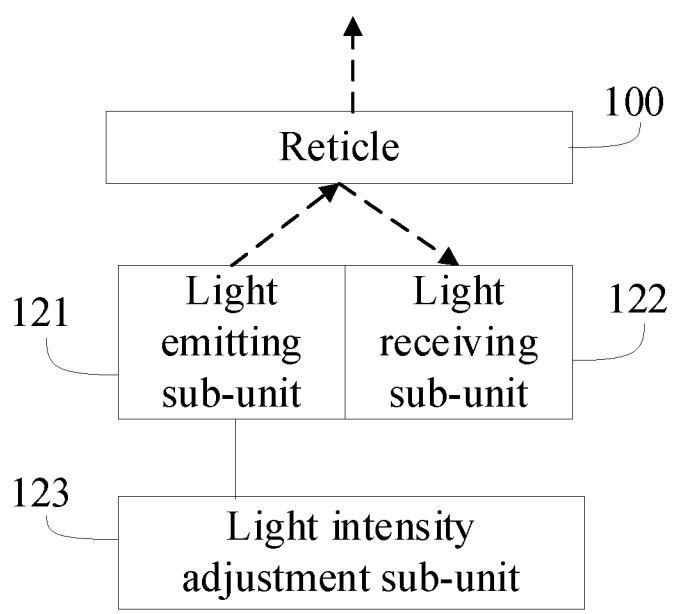
FIG. 4 is a schematic view of the detection principle of an optical detection unit according to an embodiment of the present application.

The optical detection unit 120 realizes reticle detection based on the principle of self-transmission and self-reception, as shown in FIG. 4.

Based on this, on the basis of FIG. 1, in the case where the optical detection unit 120 does not detect the reticle 100, but the auxiliary detection unit 130 detects the reticle 100, it is indicated that the current reticle 100 is highly transparent. The current optical detection method needs to be adjusted to adapt to this. Specifically, by increasing the outgoing light intensity of the light emitting sub-unit 121 by the light intensity adjustment sub-unit 123, more light may be irradiated to the reticle 100, thereby increasing the intensity of the light emitted by the reticle 100, so that the reticle 100 may be detected by the optical detection unit 120. This realizes normal detection in an optical detection manner.

Thus, in addition to the auxiliary detection unit 130, the optical detection unit 120 further comprises the light intensity adjustment sub-unit 123.

It may be understood that the preset light intensity threshold may be set according to the degree of transparency of the reticle, which is not limited in the embodiment of the present application.

Figure 5:
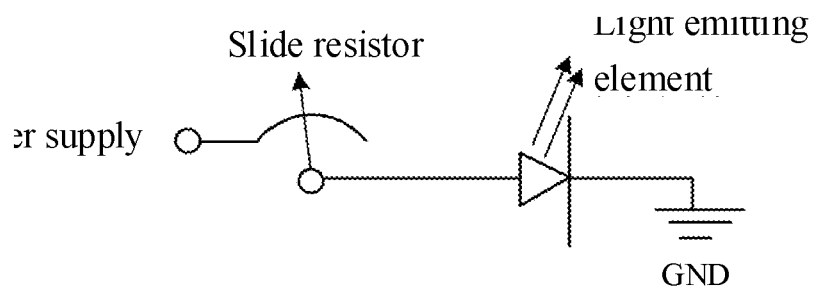
FIG. 5 is a schematic view of the principle of light intensity adjustment of an optical detection unit according to an embodiment of the present application.

In an embodiment, referring to FIGS. 4 and 5, the light emitting sub-unit 121 comprises a first light emitting element (shown as a "light emitting element" in FIG. 5), the light receiving sub-unit 122 comprises a first photoresistor (not shown), the light intensity adjustment sub-unit 123 comprises a first servo motor (may be simply referred to as "servo motor" or "motor", not shown) and an adjustment screw 1232 driven by the first servo motor.

The first light emitting element emits light irradiated to the reticle, and the first photoresistor receives the light reflected by the reticle; when the optical detection method fails to detect the reticle, the first servo motor may be used to electrically adjust the screw to rotate in order to increase the outgoing light intensity of the first light emitting element, so that the adjusted optical detection method takes effect.

Exemplarily, referring to FIG. 3, the adjustment screws 1232 may be arranged on both sides of the transceiver end 1202 (comprising the first light emitting element and the photoresistor) of the optical detection unit. In other implementations, the spatial relative positional relationship between the adjustment screw and the transceiver end may be set according to the requirements of the reticle detection apparatus 10, as long as it facilitates the adjustment. It is not limited in the embodiment of the present application.

Exemplarily, the adjustment mode of the optical detection unit 120 may comprise manual adjustment and automatic adjustment.

Exemplarily, in the manual adjustment mode, the worker can turn the adjustment screw by a screwdriver to realize the adjustment of the outgoing light intensity of the optical detection unit 120. In the automatic adjustment mode, when the optical detection unit 120 needs to be adjusted, the processing unit (for example, a CPU and a signal processing board) controls the first servo motor to rotate until the intensity of light received by the photoresistor enables the optical detection unit to detect the reticle.

Exemplarily, referring to FIG. 5, the first light emitting element divides voltage with the slide rheostat. According to Ohm's law, the resistance of the circuit, to which the slide rheostat is connected, is changed by the adjustment screw, and the voltage at both ends of the first light emitting element is thus changed. In this way, the light intensity is changed.

Exemplarily, the unit of light intensity may be Candela (cd). When the resistance of the circuit, to which the slide rheostat is connected, is 0Ω, the maximum light intensity is 36 cd; the resistance of the circuit, to which the slide rheostat is connected, is 100Ω, the maximum light intensity is 6 cd; when, by turning the knob, the resistance of the circuit, to which the slide rheostat is connected, is adjusted from 0Ω to 100Ω, the rotation of 18 πrad is needed, then the correspondence K between πrad and light intensity may be: K=(36−6)/18=1.67 cd/πrad.

In other implementations, the correspondence between the outgoing light intensity of the light emitting sub-unit 121 and the rotation angle of the adjustment screw may be set according to the requirements of the reticle detection apparatus 10, which is not limited in the embodiment of the present application.

Figure 17:
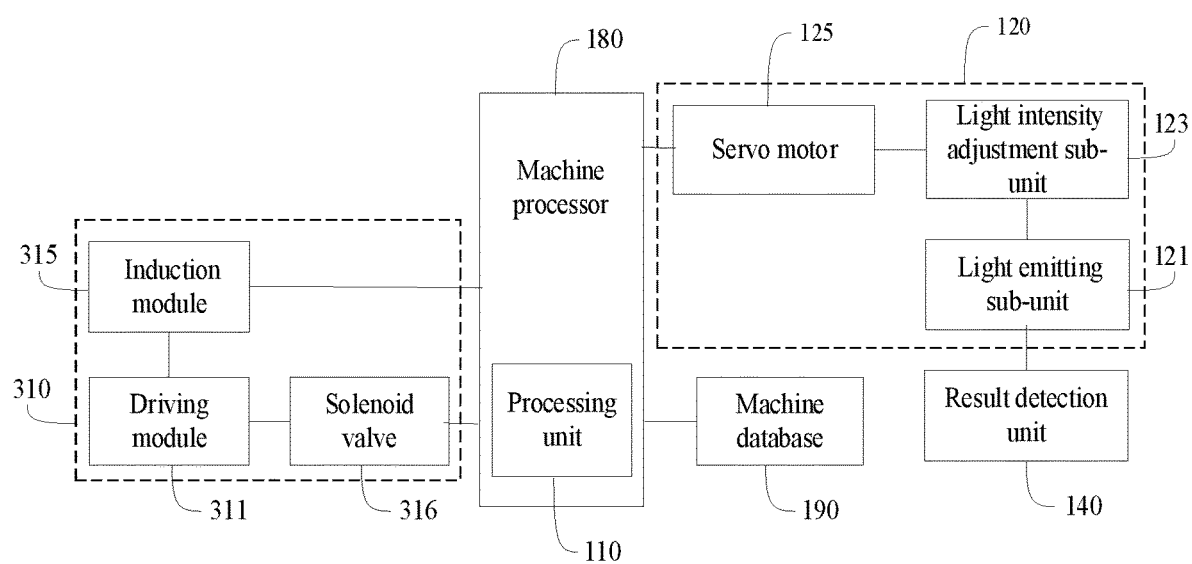
FIG. 17 is a schematic structure diagram of a photolithography device according to an embodiment of the present application.

Exemplarily, the method for the first servo motor to realize the adjustment of the light intensity may comprise: the drive shaft of the first servo motor and the adjustment screw are welded together, and when the motor rotates, the adjustment screw also rotates, and the rotation angle is recorded by the photoelectric encoder in the motor and sent back to the machine database (shown as 190 in FIG. 17).

The servo motor may be a component that controls the operation of the mechanical elements, so that the speed and position accuracy may be controlled quite accurately. The voltage signal may be converted into the torque and speed to drive the adjustment valve. The rotor speed of the servo motor is controlled by the input signal and the servo motor can respond quickly. In the automatic control system, the servo motor is used as an actuator to convert the received electrical signal into the angular displacement or angular velocity output on the motor shaft. The main feature is that there is no rotation on its own axis when the signal voltage is zero. Thus, after the adjustment is completed, the adjustment valve is in a locked state without loosening.

The servo motor is mainly positioned by pulses. Whenever the servo motor receives one pulse, the servo motor rotates by an angle corresponding to one pulse. In this way, the displacement of the servo motor is realized. Since the servo motor itself has a function of generating pulses, the servo motor generates a corresponding number of pulses whenever it rotates by an angle. In this way, those pulses are in cooperation with the pulses received by the servo motor, which may be called closed loop. Thus, the system is aware of the number of pulses sent to the servo motor and the number of pulses received. Therefore, it is able to precisely control the rotation of the motor, thus to realize precise positioning up to 0.01 rad.

In other implementations, other structural components known to those skilled in the art may be used to drive the adjustment screw to rotate, which is not limited in the embodiment of the present application.

Figure 6:
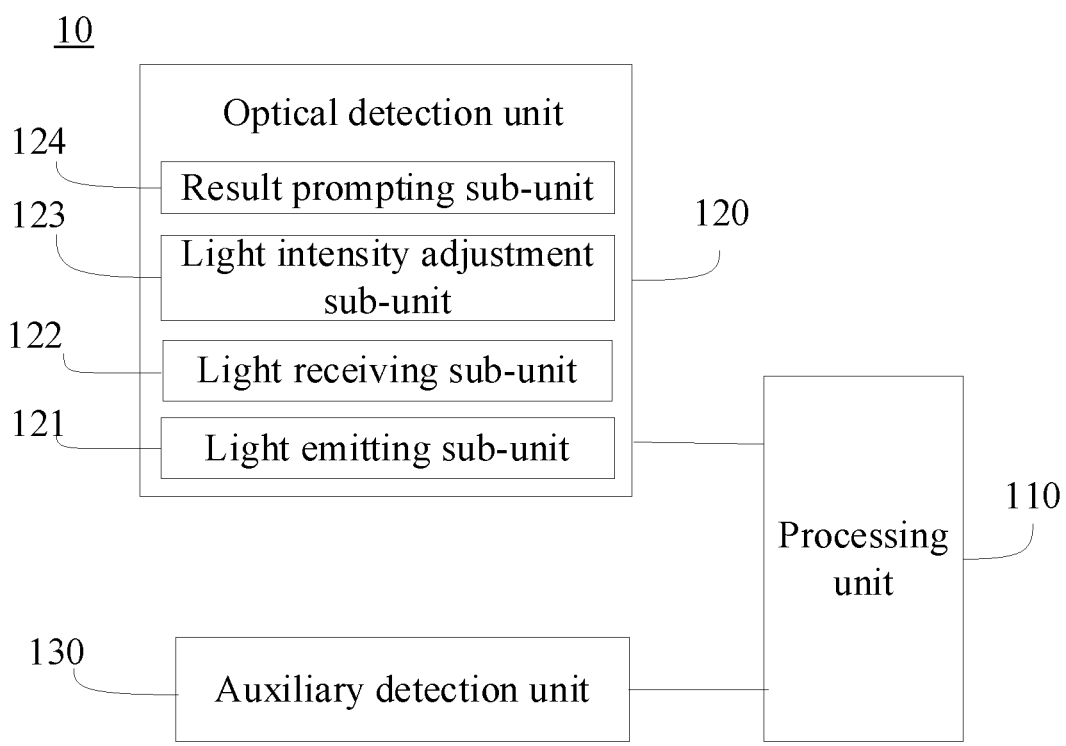
FIG. 6 is a schematic structure diagram of yet another reticle detection apparatus according to an embodiment of the present application.

In an embodiment, referring to FIG. 6, the optical detection unit 120 further comprises a result prompting sub-unit 124. The result prompting sub-unit 124 is configured to send prompt information when the optical detection unit 120 detects the reticle 100.

In this way, the detection result of the optical detection unit 120 may be displayed intuitively, which is convenient and quick.

In an embodiment, the result prompting sub-unit 124 comprises a second light emitting element.

Whether or not the second light emitting element emits light may represent whether or not the optical detection unit 120 detects the reticle.

Exemplarily, when the optical detection unit 120 detects the reticle, the second light emitting element emits light; and when the optical detection unit 120 does not detect the reticle, the second light emitting element does not emit light.

Based on this, when the auxiliary detection unit 130 detects the reticle, but the optical detection unit 120 does not detect the reticle, the adjustment screw is rotated until the second light emitting element emits light, which indicates that the optical detection unit 120 detects the reticle. Then, you can stop rotating the adjustment screw.

In other implementations, other structural forms may be used as the result prompting sub-unit 124 to prompt the detection result, which is not limited in the embodiment of the present application.

Figure 7:
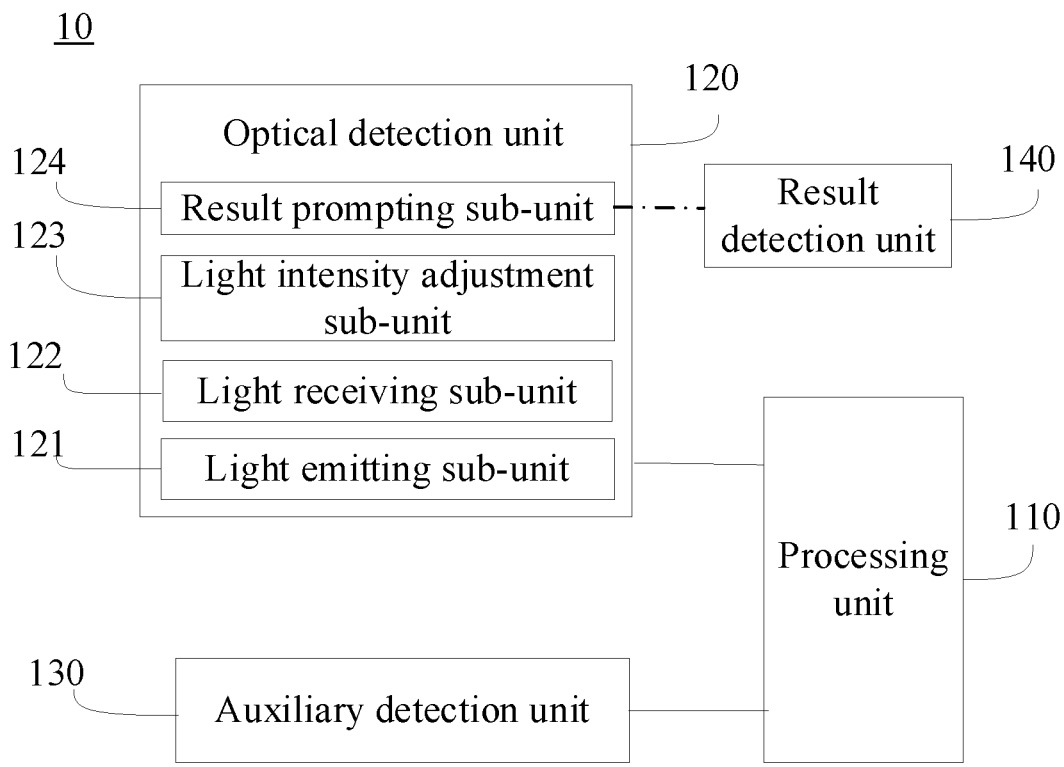
FIG. 7 is a schematic structure diagram of yet another reticle detection apparatus according to an embodiment of the present application.

In an embodiment, referring to FIG. 7, the reticle detection apparatus 10 further comprises a result detection unit 140 connected to the processing unit 110 (the result detection unit 140 can wireless connect to the processing unit 110). The result detection unit 140 is configured to detect whether the result prompting sub-unit 124 sends prompt information.

With this configuration, the detection result of the optical detection unit 120 may be further confirmed.

In an embodiment, the result detection unit 140 may comprise a second photoresistor. The light intensity adjustment sub-unit 123 is further configured to continue increasing the outgoing light intensity of second light emitting element by a preset intensity after the optical detection unit 120 also detects the reticle 100, so that the second photoresistor can effectively detect the light emitted by the second light emitting element.

The second photoresistor receives a signal from the second light emitting element (also referred to as "optical detection indicator"). When "reticle lost" occurs, in a case where the auxiliary detection unit 130 detects the reticle, the processing unit controls the first servo motor to rotate until the optical detection indicator lights up; after that, the processing unit controls the first servo motor to continue rotating by 1 πrad (in order to appropriately increase the outgoing light intensity of the optical detection unit 130), and the second photoresistor detects the light emitted by the optical detection indicator, which indicates that the reticle has been sensed by this optical detection method. The adjustment process ends, and the auxiliary detection unit 130 exits the detection mode.

It may be understood that the "preset intensity" may correspond to the rotation of 1 πrad of the adjustment screw, or other optional angles, which is not limited in the embodiment of the present application.

Figure 8:
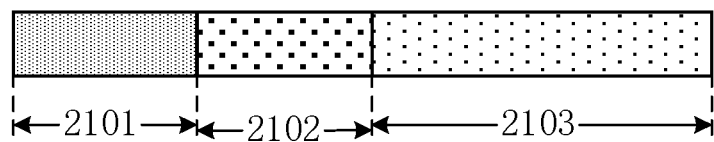
FIG. 8 is a light intensity display instruction screen of an optical detection unit according to an embodiment of the present application.
Figure 9:
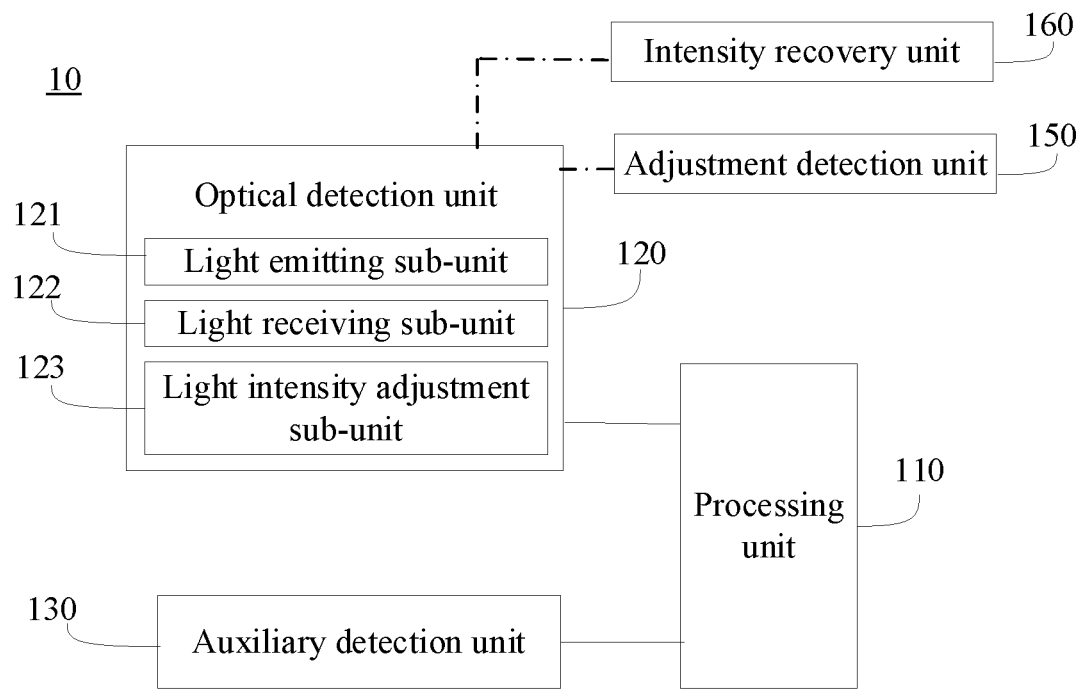
FIG. 9 is a schematic structure diagram of yet another reticle detection apparatus according to an embodiment of the present application.
Figure 10:
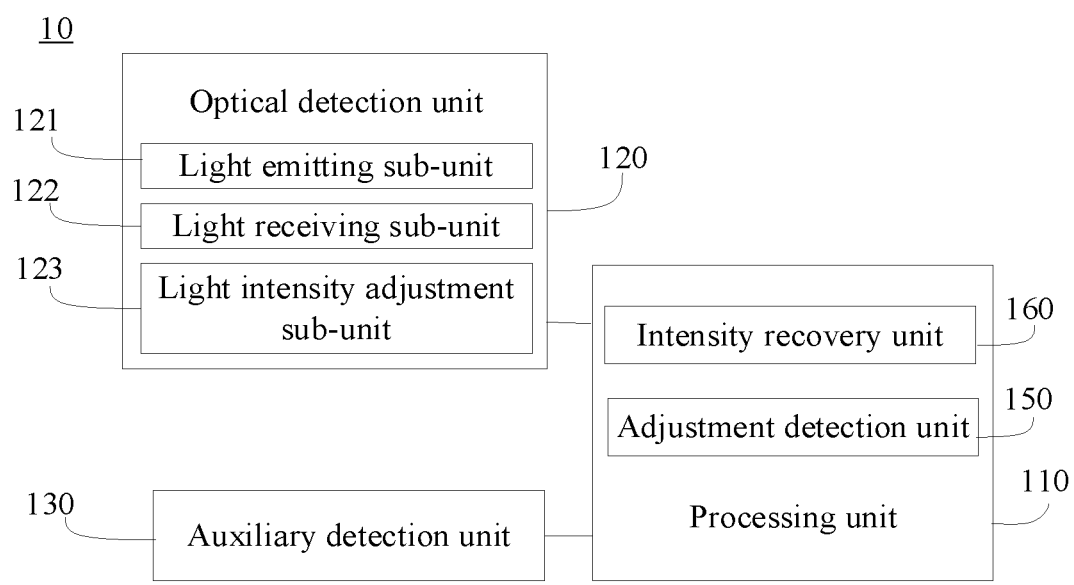
FIG. 10 is a schematic structure diagram of yet another reticle detection apparatus according to an embodiment of the present application.

In an embodiment, referring to FIG. 9 or FIG. 10, and in conjunction with FIG. 8, the reticle detection apparatus 10 further comprises an adjustment detection unit 150 and an intensity recovery unit 160; the adjustment detection unit 150 is configured to detect an adjustment record of the optical detection unit 120 after a preset time and transmit the adjustment record to the intensity recovery unit 160; and the intensity recovery unit 160 is configured to adjust the outgoing light intensity of the optical detection unit 120 back to a reference light intensity range (shown as the range indicated by 2102 in FIG. 8) when the outgoing light intensity of the optical detection unit 120 is not within the reference light intensity range.

When the optical detection unit 120 works in the reference light intensity range, it can usually achieve effective detection and it has a long service life. By adjusting the optical detection unit 120 to enable effective detection, the outgoing light intensity of the optical detection unit 120 is usually high, which may be higher than the upper limit of the reference light intensity range (for example, shown as the range indicated by 2103 in FIG. 8). In this case, the attenuation of the optical detection unit 120 is faster. In order to prevent the optical detection unit 120 from working in high intensity for a long period of time, the adjustment detection unit 150 and the intensity recovery unit 160 are provided to adjust the outgoing light intensity of the optical detection unit 120 back to a reference light intensity range when the outgoing light intensity of the optical detection unit 120 is not within the reference light intensity range, thus to ensure its service life.

Exemplarily, still referring to FIG. 9, the adjustment detection unit 150 and the intensity recovery unit 160 may be integrated with the processing unit 110. The preset time may be 7 days. The processing unit 110 may be a machine CPU of the photolithography device, which may be called machine processor. The correspondence between the rotation angle of the adjustment screw and the outgoing light intensity of the optical detection unit 120 is shown in FIG. 8. In FIG. 8, the low-intensity region 2101 corresponds to an angle of (0π-8π) rad, the reference light intensity range region 2102 corresponds to the angle of (8π-12π) rad, and the high-intensity region 2103 corresponds to an angle of (12π-18π) rad.

Based on this, the machine CPU may record the rotation angle of the adjustment screw (for example, the adjustment record of the servo motor). Before the adjustment, that is, the default position recorded by the machine CPU, may be within the reference light intensity range region 2102; and during the adjustment, the adjustment screw rotates clockwise or counterclockwise by a certain angle, and the light intensity changes to the high-intensity region 2103. In 7 d after the adjustment, the machine CPU will detect the adjustment record of the optical detection unit 120. If the angle of the adjustment screw is not within the angle value range (8π-12π) rad corresponding to the reference light intensity range, the outgoing light intensity of the optical detection unit 120 may be adjusted back to the corresponding angle default position to prevent the optical detection unit 120 from working in high intensity for a long period of time to affect its service life.

The structural form and working principle of the auxiliary detection unit 130 will be exemplarily described below with reference to FIGS. 11-14.

In an embodiment, referring to FIGS. 11-14, the auxiliary detection unit 130 comprises a pressure detection module 310 or an sound wave detection module 320, and further comprises a bearing unit 170, and a bearing surface 171 of the bearing unit 170 is configured to bear the reticle 100; wherein, the bearing surface 171 comprises a first opening 1711 and a second opening 1712, and the pressure detection module 310 or the sound wave detection module 320 detects whether there is a reticle 100 on the bearing surface 171 through the first opening 1711, and the optical detection unit 120 detects whether there is a reticle 100 on the bearing surface 171 through the second opening 1712.

The pressure detection module 310 realizes the detection of the reticle 100 based on that the pressure detection module contacts with the reticle 100, and the sound wave detection module 320 realizes the detection of the reticle 100 based on the reflection of the detection sound waves by the reticle 100. The formation of the first opening 1711 and the second opening 1712 on the bearing surface 171 can meet the detection requirements.

Figure 11:
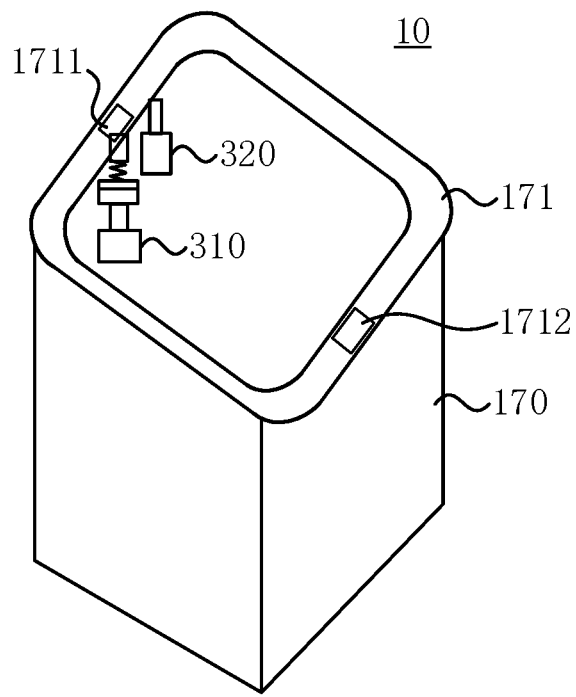
FIG. 11 is a stereoscopic structure diagram of yet another reticle detection apparatus according to an embodiment of the present application.
Figure 12:
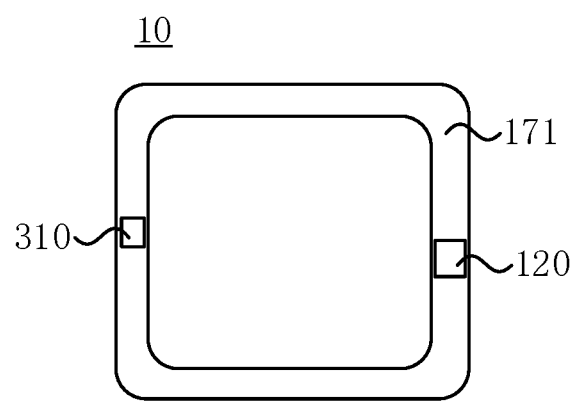
FIG. 12 is a schematic structure diagram of the reticle detection apparatus of FIG. 11, when viewed from the top.
Figure 13:
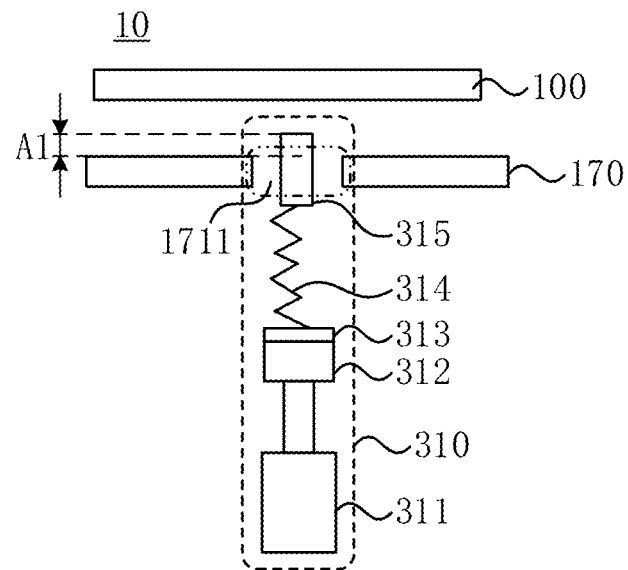
FIG. 13 is a schematic structure diagram of yet another reticle detection apparatus according to an embodiment of the present application, when viewed from the front.
Figure 14:
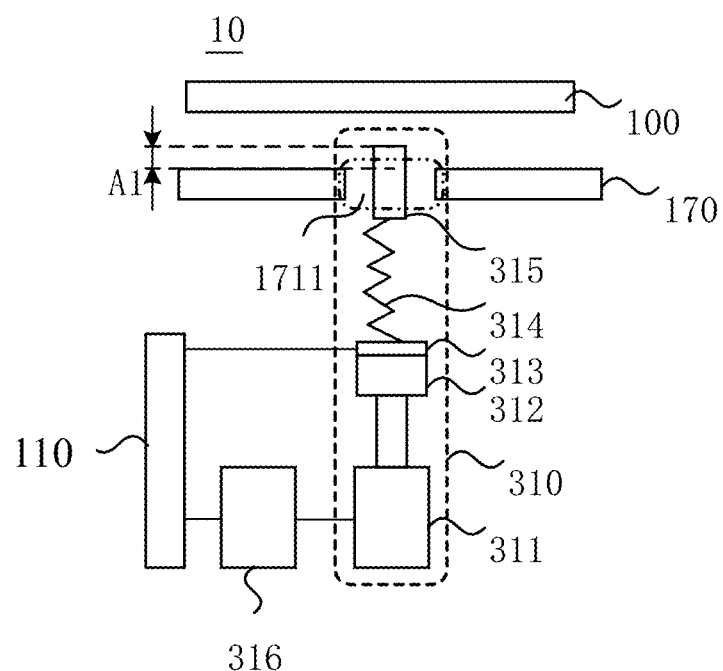
FIG. 14 is a schematic structure diagram of yet another reticle detection apparatus according to an embodiment of the present application.

Exemplarily, as shown in any one of FIGS. 12-14, the auxiliary detection unit 130 may comprise only the pressure detection module 310. Or, as shown in FIG. 11, the auxiliary detection unit 130 may comprise both a pressure detection module 310 and a sound wave detection module 320.

Exemplarily, FIG. 12 shows that the pressure detection module 310 and the optical detection unit 120 are disposed on opposite sides of the bearing surface 171. In other implementations, the spatial relative positional relationship between the structural components in the auxiliary detection unit 130 and the structural components in the optical detection unit 120 may be set according to the requirements of the reticle detection apparatus 10, which is not limited in the embodiment of the present application.

In an embodiment, referring to FIG. 13 or FIG. 14, the pressure detection module 310 comprises a driving module 311, a support module 312, a pressure sensitive module 313, an elastic module 314, and an induction module 315; the support module 312 is fixedly connected to the movable end of the driving module 311, the pressure sensitive module 313 is fixed on a side of the support module 312 away from the driving module 311, and both ends of the elastic module 314 are respectively and fixedly connected to the pressure sensitive module 313 and the induction module 315; and when the auxiliary detection unit 130 is started, the movable end of the driving module 311 extends outward, and drives the induction module 315 by the support module 312, the pressure sensitive module 313, and the elastic module 314 so that the induction module 315 moves toward the bearing surface 171; the induction module 315 is configured to pass through the first opening 1711 and exceed the bearing surface 171 by a preset distance.

When the optical detection method is effective, the pressure detection module 310 does not work, and the induction module 315 is located below the bearing surface 171. When the optical detection method fails, the pressure detection module 310 is started, and the induction module 315 passes through the first opening 1711 and exceeds the bearing surface 171 by a preset distance A1. In this case, if the reticle 100 has been successfully loaded, the reticle 100 contacts and squeezes the induction module 315, and the induction module 315 moves toward the pressure sensitive module 313 while compressing the elastic module 314, so that the pressure sensitive module 313 is stressed to determine that there is a reticle 100 on the bearing surface 171.

In an embodiment, still referring to FIG. 13 or FIG. 14, the preset distance A1 is equal to or less than 2 mm.

With such an arrangement, while ensuring that the pressure detection module 310 can effectively detect the reticle 100, the induction module 315 will not exceed the bearing surface 171 too high, thereby avoiding the damage to the reticle 100 caused when the induction module 315 excessively squeezes the reticle 100.

In other implementations, the value of A1 may be A1≤1.5 mm, A1=0.1 mm, or other numerical ranges known to those skilled in the art, which is not limited in the embodiments of the present application.

In an embodiment, the driving module 311 comprises an air cylinder (or "miniature cylinder") and a cylinder rod driven by the air cylinder, or comprises a second servo motor and a connecting rod driven by the second servo motor; and the support module 312 comprises a support plate, the pressure sensitive module 313 comprises a pressure sensitive resistor, the elastic module 314 comprises a return spring, and the induction module 315 comprises an induction contact.

Exemplarily, the miniature cylinder is controlled by a solenoid valve 316 (shown in FIG. 17) to switch on or off.

Based on this, the detection principle of the reticle detection apparatus 10 will be exemplarily described below. In a case where there is no reticle with high transparency to be loaded on the IRIS apparatus, when the optical detection unit can work normally, the induction contact is lower than the upper surface of the bearing unit 170 (that is, the bearing surface 171). When a reticle 100 is placed on the bearing surface 171, the induction contact will not be stressed, and the miniature cylinder and the return spring are in a non-acting state. When a reticle with high transparency has been loaded in the IRIS apparatus, the solenoid valve 316 is in an open state to provide compressed dry air (also called "CDA airflow") to the miniature cylinder. The miniature cylinder stretches and drives the return spring to move upward until the induction contact is 2 mm higher than the bearing surface 171. Then, the miniature cylinder stops working, and the return spring stays at the current position. In this way, when the reticle 100 is loaded onto the bearing unit 170 and seated on the bearing surface 171, it will press the induction contact to move downward, drive the return spring to compress, and transfer the pressure to the pressure sensitive resistor below the return spring. The output signal of the pressure sensitive resistor is processed by the subsequent processing unit and then provided to the machine CPU for analysis and determination. After the reticle 100 is removed, the induction contact returns to its position under the action of the return spring, where it exceeds the bearing surface 171, to prepare for the next detection.

In other implementations, other structural components known to those skilled in the art may be used to drive the pressure sensitive resistor, the return spring and the induction contact to move, which is not limited in the embodiment of the present application.

Based on the same application concept, an embodiment of the present application further provides a reticle detection method, which is executed by any of the reticle detection apparatuses provided in the above implementations. Therefore, the reticle detection method also has the beneficial effects of the reticle detection apparatus in the above implementations. The similarities may be understood with reference to the above explanation of the reticle detection apparatus, and will not be repeated hereafter.

Figure 15:
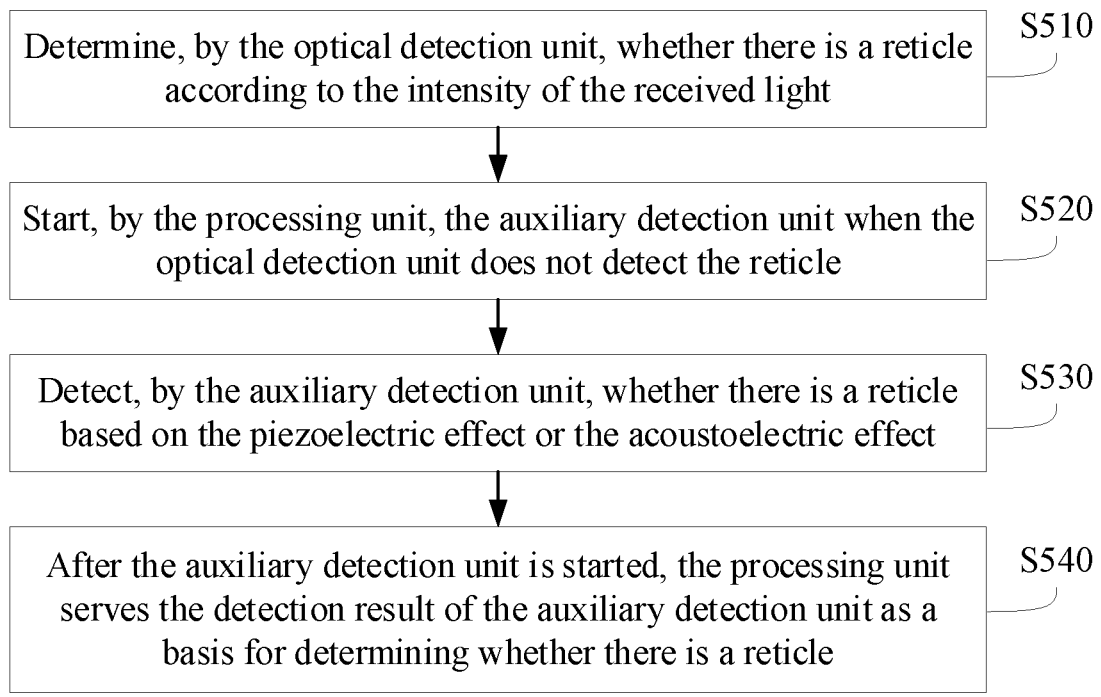
FIG. 15 is a schematic flowchart of a reticle detection method according to an embodiment of the present application.
Figure 16:
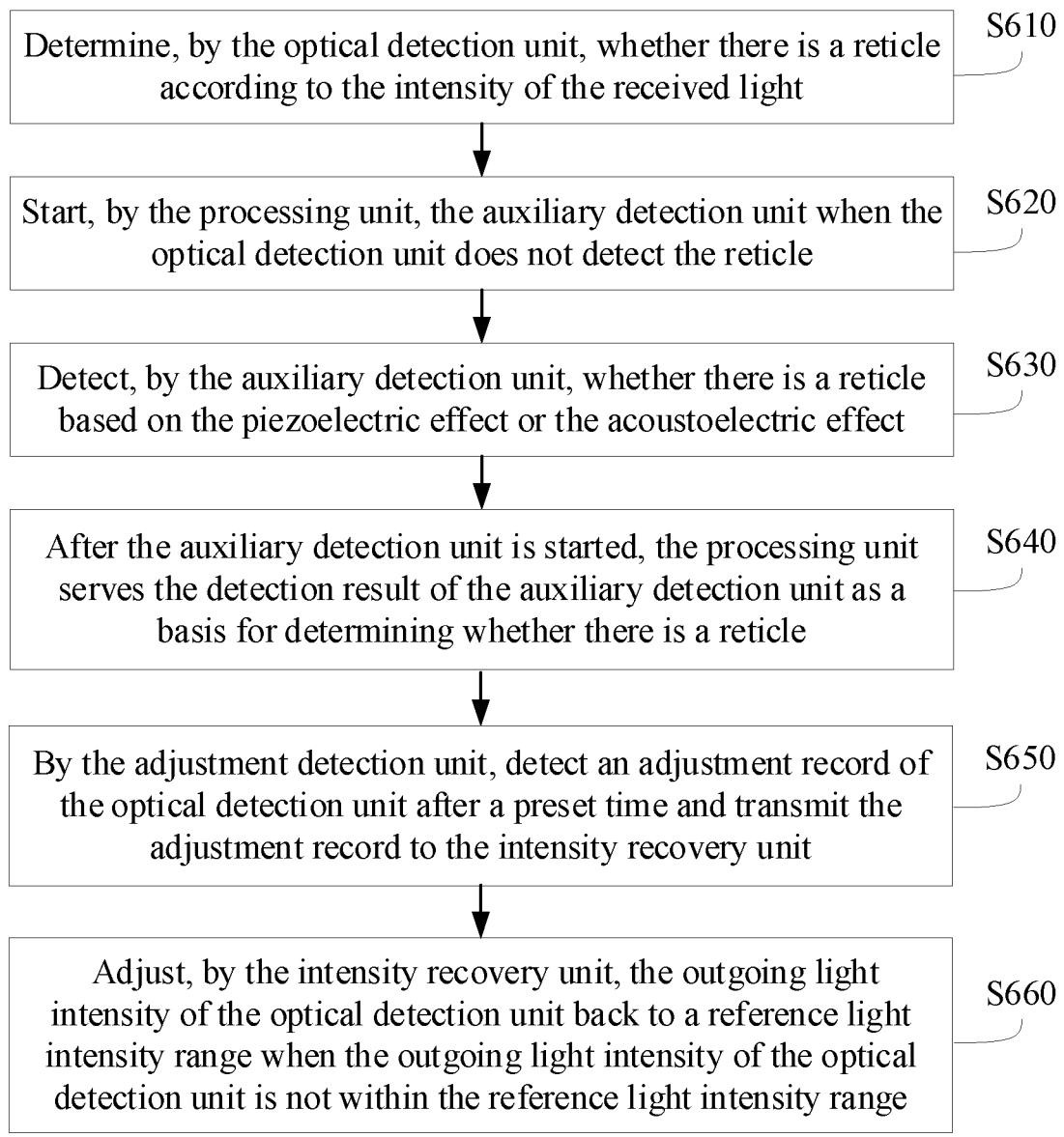
FIG. 16 is a schematic flowchart of another reticle detection method according to an embodiment of the present application.

Exemplarily, referring to FIG. 15, the reticle detection method may comprise:

S510: determining, by the optical detection unit, whether there is a reticle according to the intensity of the received light;

S520: starting, by the processing unit, the auxiliary detection unit when the optical detection unit does not detect the reticle;

S530: detecting, by the auxiliary detection unit, whether there is a reticle based on the piezoelectric effect or the acoustoelectric effect; and S540: after the auxiliary detection unit is started, the processing unit serves the detection result of the auxiliary detection unit as a basis for determining whether there is a reticle.

Thus, in the reticle detection method, when the optical detection unit fails to detect the reticle, the auxiliary detection unit may be used to detect the reticle, so that the detection accuracy of the reticle may be improved and it helps to avoid machine downtime.

In an embodiment, the optical detection unit comprises a light emitting sub-unit, a light receiving sub-unit, and a light intensity adjustment sub-unit. Based on this, in the reticle detection method, the method procedure for the optical detection unit to achieve effective reticle detection by adjusting the outgoing light intensity may comprise:

step one: emitting outgoing light by the light emitting sub-unit;

step two: receiving reflected light by the light receiving sub-unit; and step three: adjusting, by the light intensity adjustment sub-unit, the outgoing light intensity of the outgoing light emitted by the light emitting sub-unit, so that the incident light intensity of the reflected light received by the light receiving sub-unit is greater than a preset light intensity threshold when the auxiliary detection unit detects the reticle.

Thus, it is possible to complete the adjustment of the optical detection unit and the IRIS detection of the reticle without the machine downtime, which facilitates the simplification of subsequent testing procedures for similar reticles.

In an embodiment, in order to prevent the optical detection unit from working in high intensity for a long period of time, the reticle detection apparatus may further comprise an adjustment detection unit and an intensity recovery unit. Based on this, referring to FIG. 16, the reticle detection method may comprise:

S610: determining, by the optical detection unit, whether there is a reticle according to the intensity of the received light.

S620: starting, by the processing unit, the auxiliary detection unit when the optical detection unit does not detect the reticle;

S630: detecting, by the auxiliary detection unit, whether there is a reticle based on the piezoelectric effect or the acoustoelectric effect;

S640: after the auxiliary detection unit is started, the processing unit serves the detection result of the auxiliary detection unit as a basis for determining whether there is a reticle;

S650: by the adjustment detection unit, detecting an adjustment record of the optical detection unit after a preset time and transmitting the adjustment record to the intensity recovery unit; and S660: adjusting, by the intensity recovery unit, the outgoing light intensity of the optical detection unit back to a reference light intensity range when the outgoing light intensity of the optical detection unit is not within the reference light intensity range.

In this way, this may prevent the optical detection unit from working in high intensity for a long period of time to affect the service life, which is beneficial to prolong the service life of the optical detection unit and the reticle detection apparatus.

On the basis of the above implementations, an embodiment of the present application further provides an exposure machine comprising any of the reticle detection apparatuses provided in the above implementations. Therefore, the exposure machine also has the beneficial effects of the reticle detection apparatus in the above implementations. The similarities may be understood with reference to the above explanation of the reticle detection apparatus, and will not be repeated hereafter.

In other embodiments, the exposure machine may further comprise other structural components known to those skilled in the art, such as a reticle transfer system and an optical projection system, which is not described or limited in the embodiment of the present application.

On the basis of the above implementations, an embodiment of the present application further provides a photolithography device comprising any of the exposure machines provided in the above implementations. Therefore, the photolithography device also has the beneficial effects of the exposure machine and the reticle detection apparatus in the above implementations. The similarities may be understood with reference to the above explanation of the reticle detection apparatus and the exposure machine, and will not be repeated hereafter.

In an embodiment, referring to FIG. 17, the photolithography device further comprises a machine processor 180 (also called machine CPU 180). The processing unit 110 is integrated in the machine CPU 180 or the processing unit 110 is communicatively connected to the machine CPU 180.

With such an arrangement, the overall structure of the photolithography device comprising the reticle detection apparatus may be made simpler.

On the basis of the above implementations, the detection process of the photolithography device will be exemplarily described below.

The pressure detection module is used as the auxiliary reticle detection unit, and its core working devices comprise a pressure sensitive resistor, a return spring and an induction contact. When the optical detection method is effective, the pressure sensitive resistor moves down under the action of the air cylinder. In this case, when the reticle is placed on the bearing unit, the induction contact will not be stressed and the pressure sensitive resistor will not work. When there is a new reticle (i.e., a reticle with high transparency) that needs to be tested for a new product, the reticle ID used by the new product is entered into the machine database, and when the machine CPU detects the corresponding reticle ID in the machine database, the auxiliary detection unit is started. The pressure detection module works. When the optical detection unit fails to detect the reticle, but the pressure detection module can sense the reticle, the IRIS of the machine will make a determination based on the detection result of the pressure detection module. Thus, the machine downtime is avoided. Meanwhile, the machine CPU controls the motor driver to realize the rotation of the first servo motor. When the second photoresistor detects that the optical detection indicator lights up, the adjustment process of the optical detection unit ends. Thus, the outgoing light intensity of the optical detection unit is adjusted to adapt to the detection of the reticle with high transparency.

In the above detection process, if the auxiliary detection unit also does not detect the reticle, it may be considered as "reticle lost", and the machine needs to be shut down for detection.

After the adjustment step is completed, the adjustment of the optical detection unit is recorded, so as to prepare for the subsequent recovery of the light intensity parameters of the optical detection unit.

Exemplarily, the machine CPU detects the current adjustment record of the optical detection unit seven days after the above detection process is completed, to determine whether the outgoing light intensity of the optical detection unit is within the reference light intensity range; if not, the machine CPU sends an adjustment instruction to the motor driver to control the first servo motor to drive the adjustment screw to rotate until the outgoing light intensity of the optical detection unit is within the reference light intensity range.

Therefore, the photolithography device has at least the following beneficial effects.

1) When the machine robot has put the reticle into the IRIS, and when the optical detection fails and it may be considered as "reticle lost", the auxiliary detection unit is started; and when the auxiliary detection unit detects the reticle, it is indicated that the light intensity of the optical detection unit is too low to meet the detection conditions of the current reticle. In this case, the optical detection unit is adjusted to increase its outgoing light intensity so that it is suitable for the current reticle. Thus, this may avoid the misjudgment of "reticle lost" which may cause machine downtime.

2) The need for immediate manual adjustment based on the "reticle lost" determined by the optical detection unit is avoided. Thus, the difficulty of operation is decreased and the utilization rate of the machine is increased.

3) By showing the correspondence between the rotation angle of the adjustment screw and the outgoing light intensity of the optical detection unit (also referred to as "display bar for the light intensity at the emitting end of the optical detection unit"), the current light intensity of the optical detection unit may be displayed more intuitively.

4) After the preset time, the outgoing light intensity of the optical detection unit is adjusted back to the reference light intensity range in time, which is beneficial to reduce the loss of the optical detection unit and prolong its service life.

In other implementations, the photolithography device may further comprise other structural components known to those skilled in the art, such as a glue application system, a developing system, and an etching system, which is not described or limited in the embodiment of the present application.

Note that the above descriptions are only preferred embodiments of the present application and the technical principles applied. It may be understood by those skilled in the art that the present application is not limited to the specific embodiments described herein, and various apparent changes, adjustments and substitutions can be made without departing from the protection scope of the present application. Therefore, although the present application has been described in detail by the above embodiments, the present application is not limited to those embodiments and may comprise more other equivalent embodiments without departing from the concept of the present application. The scope of the present application is defined the appended claims.

What is claimed is:

1. A reticle detection apparatus, comprising a processing unit, an optical detection unit and an auxiliary detection unit;
   the optical detection unit is configured to determine whether there is a reticle according to the intensity of the received light;
   the processing unit is configured to start the auxiliary detection unit when the optical detection unit does not detect the reticle;
   the auxiliary detection unit is configured to detect whether there is a reticle based on the piezoelectric effect or the acoustoelectric effect;
   wherein, after the auxiliary detection unit is started, the processing unit is configured to serve the detection result of the auxiliary detection unit as a basis for determining whether there is a reticle.

2. The reticle detection apparatus according to claim 1, wherein the optical detection unit comprises a light emitting sub-unit, a light receiving sub-unit, and a light intensity adjustment sub-unit;
   the light emitting sub-unit is configured to emit outgoing light;
   the light receiving sub-unit is configured to receive reflected light; and
   the light intensity adjustment sub-unit is configured to adjust the outgoing light intensity of the outgoing light emitted by the light emitting sub-unit, so that the incident light intensity of the reflected light received by the light receiving sub-unit is greater than a preset light intensity threshold when the auxiliary detection unit detects the reticle.

3. The reticle detection apparatus according to claim 2, wherein the light emitting sub-unit comprises a first light emitting element, the light receiving sub-unit comprises a first photoresistor, and the light intensity adjustment sub-unit comprises a first servo motor and an adjustment screw driven by the first servo motor.

4. The reticle detection apparatus according to claim 3, wherein the first light emitting unit is configured to emit light irradiated to the reticle, and the first photoresistor is configured to receive light reflected by the reticle; and the first servo motor is configured to adjust the rotation of the screw when the first photoresistor does not detect the reticle.

5. The reticle detection apparatus according to claim 2, wherein the optical detection unit further comprises a result prompting sub-unit; and
   the result prompting sub-unit is configured to send prompt information when the optical detection unit detects the reticle.

6. The reticle detection apparatus according to claim 5, wherein the result prompting sub-unit comprises a second light emitting element.

7. The reticle detection apparatus according to claim 6, further comprising a result detection unit connected to the processing unit; and
   the result detection unit is configured to detect whether the result prompting sub-unit sends prompt information.

8. The reticle detection apparatus according to claim 7, wherein the result detection unit comprises a second photoresistor.

9. The reticle detection apparatus according to claim 2, further comprising an adjustment detection unit and an intensity recovery unit;
   the adjustment detection unit is configured to detect an adjustment record of the optical detection unit after a preset time and transmit the adjustment record to the intensity recovery unit; and
   the intensity recovery unit is configured to adjust the outgoing light intensity of the optical detection unit back to a reference light intensity range, when the outgoing light intensity of the optical detection unit is not within the reference light intensity range.

10. The reticle detection apparatus according to claim 9, wherein the adjustment detection unit and the intensity recovery unit are integrated with the processing unit.

11. The reticle detection apparatus according to claim 1, wherein the auxiliary detection unit comprises a pressure detection module or a sound wave detection module;
    the reticle detection apparatus further comprises a bearing unit, and a bearing surface of the bearing unit is configured to bear the reticle; wherein, the bearing surface comprises a first opening and a second opening, and the pressure detection module or the sound wave detection module detects whether there is a reticle on the bearing surface through the first opening, and the optical detection unit detects whether there is a reticle on the bearing surface through the second opening.

12. The reticle detection apparatus according to claim 11, wherein the pressure detection module comprises a driving module, a support module, a pressure sensitive module, an elastic module, and an induction module;

the support module is fixedly connected to the movable end of the driving module, the pressure sensitive module is fixed on a side of the support module away from the driving module, and both ends of the elastic module are respectively and fixedly connected to the pressure sensitive module and the induction module; and when the auxiliary detection unit is started, the movable end of the driving module extends outward, and drives the induction module by the support module, the pressure sensitive module, and the elastic module so that the induction module moves toward the bearing surface; the induction module is configured to pass through the first opening and exceed the bearing surface by a preset distance.

13. The reticle detection apparatus according to claim 12, wherein the preset distance is equal to or less than 2 mm.

14. The reticle detection apparatus according to claim 12, wherein the driving module comprises an air cylinder and a cylinder rod driven by the air cylinder, or comprises a second servo motor and a connecting rod driven by the second servo motor; and the support module comprises a support plate, the pressure sensitive module comprises a pressure sensitive resistor, the elastic module comprises a return spring, and the induction module comprises an induction contact.

15. A reticle detection method, executed by the reticle detection apparatus according to claim 1, comprising:

determining, by the optical detection unit, whether there is a reticle according to the intensity of the received light;

starting, by the processing unit, the auxiliary detection unit when the optical detection unit does not detect the reticle;

detecting, by the auxiliary detection unit, whether there is a reticle based on the piezoelectric effect or the acoustoelectric effect;

wherein, after the auxiliary detection unit is started, the processing unit serves the detection result of the auxiliary detection unit as a basis for determining whether there is a reticle.

16. The reticle detection method according to claim 15, wherein the optical detection unit comprises a light emitting sub-unit, a light receiving sub-unit, and a light intensity adjustment sub-unit; and the reticle detection method further comprises:

emitting outgoing light by the light emitting sub-unit;

receiving reflected light by the light receiving sub-unit; and adjusting, by the light intensity adjustment sub-unit, the outgoing light intensity of the outgoing light emitted by the light emitting sub-unit, so that the incident light intensity of the reflected light received by the light receiving sub-unit is greater than a preset light intensity threshold when the auxiliary detection unit detects the reticle.

17. The reticle detection method according to claim 15, wherein the reticle detection apparatus further comprises an adjustment detection unit and an intensity recovery unit; and the reticle detection method further comprises:

by the adjustment detection unit, detecting an adjustment record of the optical detection unit after a preset time and transmitting the adjustment record to the intensity recovery unit; and adjusting, by the intensity recovery unit, the outgoing light intensity of the optical detection unit back to a reference light intensity range, when the outgoing light intensity of the optical detection unit is not within the reference light intensity range.

18. An exposure machine, comprising the reticle detection apparatus according to claim 1.

19. A photolithography device, comprising the exposure machine according to claim 18.

20. The photolithography device according to claim 19, further comprising a machine processor; and the processing unit is communicatively connected to the machine processor.

* * * * *